United States Patent
Zhu et al.

(10) Patent No.: US 9,469,150 B2
(45) Date of Patent: Oct. 18, 2016

(54) ADDRESSABLE OBJECTS STORAGE CONTAINER WITH INTERCONNECT PANEL

(71) Applicants: Shengbo Zhu, San Jose, CA (US); Su Shiong Huang, Bellevue, WA (US)

(72) Inventors: Shengbo Zhu, San Jose, CA (US); Su Shiong Huang, Bellevue, WA (US)

(73) Assignee: MICRODATA CORPORATION, San Jose, CA (US)

( * ) Notice: Subject to any disclaimer, the term of this patent is extended or adjusted under 35 U.S.C. 154(b) by 161 days.

(21) Appl. No.: 14/121,761

(22) Filed: Oct. 15, 2014

(65) Prior Publication Data

US 2016/0113134 A1    Apr. 21, 2016

(51) Int. Cl.
| | | |
|---|---|---|
| *B42F 21/00* | (2006.01) | |
| *H05K 5/02* | (2006.01) | |
| *B42F 21/06* | (2006.01) | |
| *H05K 5/03* | (2006.01) | |

(52) U.S. Cl.
CPC .............. *B42F 21/00* (2013.01); *B42F 21/065* (2013.01); *H05K 5/0217* (2013.01); *H05K 5/0247* (2013.01); *H05K 5/03* (2013.01)

(58) Field of Classification Search
None
See application file for complete search history.

(56) References Cited

U.S. PATENT DOCUMENTS

2011/0304456 A1* 12/2011 Zhu .................. E05B 17/10
340/540

* cited by examiner

*Primary Examiner* — Daniell L Negron

(57) ABSTRACT

A storage container and matching cover for storing addressable objects. The storage container has an interconnect panel with a pair of laterally spaced address signal conductors extending vertically along the panel and terminating at the top and bottom edges of the panel in conductive terminal pads. The cover has an interconnect mechanism with spring biased translatable conductive probes positioned to mate with the conductive terminal pads of an upper and lower container when two containers are vertically stacked. The combination of the container and cover eliminates the need for individual USB jumper cables when interconnecting two or more vertically stacked containers. An auto alignment feature ensures that the containers are properly stacked with the terminal pads in contact with the conductive probes.

18 Claims, 7 Drawing Sheets

ADDRESSABLE OBJECTS STORAGE CONTAINER WITH INTERCONNECT PANEL

BACKGROUND OF THE INVENTION

This invention relates in general to storage containers designed to enable remote electronic searching for objects, such as file folders and documents within file folders, located within the containers. More particularly, this invention relates to an addressable objects storage container with an interconnect panel for electrically interconnecting two or more such containers when stacked vertically.

Some known storage containers are constructed according to a unique design for enabling remote electronic searching for objects, such as file folders and documents within such file folders, located somewhere within a collection of electrically interconnected storage containers. Commonly assigned pending U.S. patent application Ser. No. 13/694,829 filed Jan. 8, 2013 for "Storage Container For Electronically Addressable File Folders And Documents", the disclosure of which is hereby incorporated by reference, discloses such a container design. Each container is provided with a pair of electrically conductive support rails mounted in the container interior near the top margin. The rails are laterally spaced by an amount designed to receive the ends of support braces incorporated into file folders removably placed within the container to provide both mechanical support for each file folder and electrical connections to circuitry including an address decoder located within one of the file folder support braces in each file folder. The circuitry in the support brace also includes a pair of visible indicators: a POWER ON indicator, and an ADDRESS MATCH indicator. The circuitry in the support brace is described and illustrated in commonly-assigned, co-pending U.S. patent application Ser. No. 12/803,712 filed Jul. 2, 2010 for "Documents Management Using Remote Document Location And Retrieval", the disclosure of which is hereby incorporated by reference.

A container circuit board is mounted in the container and contains electronic circuitry for receiving unique address signals supplied by a host computer via a local controller which identify a folder or document to be located. The rails within the container are individually coupled to the electronic circuitry on the container circuit board: one of the rails receives the address signals from the local controller and supplies them to all file folders residing in the container; and furnishes response signals from the file folders to the electronic circuitry of the container circuit board. These response signals are coupled to the local controller, which sends the information contained in the signals to the host computer. The information in the response signals includes the identification of the storage container in which the found folder is located. The visible POWER ON indicator on each file folder is activated whenever the folder brace is ohmically connected to the container rails in order to signify that the file folder is installed correctly and is operable. The visible ADDRESS MATCH indicator on each file folder is activated whenever the address stored in the circuitry in a folder brace matches the folder address supplied to the file folder circuitry by the local controller via the container rails.

Each container also has a visible indicator mounted on a wall in a position visible to a human operator standing within viewing distance of the storage container. This indicator is coupled to the electronic circuitry on the container circuit board and is illuminated whenever the address signals supplied by the host computer specify a file folder or document located in that container. An input connector and an output connector are also mounted on one of the walls of the container: the input connector receives the address signals from the host computer via the local controller; the output connector couples address signals from one container to another container and returns search result information from any container to the local controller. The local controller sends this information to the host computer.

The storage containers are typically distributed about a storage area with the input connector of one container coupled to the local controller and the output connector of that container coupled to the input connector of another container. The remaining ones of the collection of containers are electrically interconnected by coupling the output connector of a given container to the input connector of another container. The intercoupling is accomplished using USB jumper cables.

While the array of storage containers can be distributed about the storage area in any convenient manner, the most efficient use of the storage area can be achieved by stacking the containers vertically, with one container positioned on top of another. In this preferred configuration it is still necessary to electrically intercouple all containers in the vertical stack using the USB jumper cables. Depending on the number of containers in a stack, and the number of stacks of containers, this requires a relatively large number of USB jumper cables, which is less than optimal.

SUMMARY OF THE INVENTION

The invention comprises an addressable objects storage container of the type described above which is provided with an interconnect panel and a matching cover for the container having an interconnect mechanism which electrically intercouple the address signals supplied to that container by the local controller to the address signal conductors of another container when the two containers are stacked in a vertical configuration. This eliminates the need for USB jumper cables to intercouple the two containers when vertically stacked.

In a broadest aspect, the invention comprises a storage container for removably storing addressable objects, the storage container including a plurality of walls forming a storage volume with an upper region, and an interconnect panel secured to one of the plurality of walls, the interconnect panel having a top edge and a bottom edge and including a pair of laterally spaced address signal conductors extending between the top edge and the bottom edge and terminating in conductive terminal pads; and a cover for the storage container, the cover including an interconnect mechanism secured thereto and having a laterally spaced pair of spring biased translatable conductive probes, the location of the interconnect mechanism on the cover and the spacing of the probes enabling the probes to individually engage the terminal pads of an upper container and a lower container when the upper container and the lower container are stacked in a vertical manner so that address signals present on the address signal conductors of one of the upper container and the lower container are coupled to the address signal conductors of the other one of the upper container and the lower container.

The interconnect panel preferably has an address signal input port coupled to the address signal conductors and an address signal output port coupled to the address signal conductors.

The storage container has a pair of laterally spaced electrically conductive mounting rods within the upper region; and the interconnect panel includes a pair of mounting clips each electrically coupled to a different one of the address signal conductors and each secured to the interconnect panel adjacent the top edge, with each mounting clip being engaged with a different one of the pair of mounting rods to secure the interconnect panel to the wall of the container at the upper edge of the interconnect panel. Fastener means is used to secure the lower edge of the interconnect panel to the wall of the container The cover has a top surface, a bottom surface, and an aperture; and the interconnect mechanism includes a mounting block secured to the cover for containing the probes, the mounting block being positioned on the cover with the probes extending through the aperture. The mounting block has a laterally spaced pair of through bores for containing the probes; and a pair of generally cylindrical ferrules are each secured in a different one of the through bores, with the probes translatably received within the ferrules, and a pair of biasing springs are each mounted in a different one of the ferrules between an opposing pair of probes for urging the corresponding pair of probes outwardly of the mounting block.

An auto alignment mechanism is included for urging an upper container into proper physical alignment with the cover of a lower container when the upper container and the lower container are stacked in a vertical manner. The auto alignment mechanism preferably comprises mutually conformable shapes to the upper surface of the cover and the bottom of the container so that mutual engagement with a snug fit is achieved between a cover and the bottom of a container.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 1:
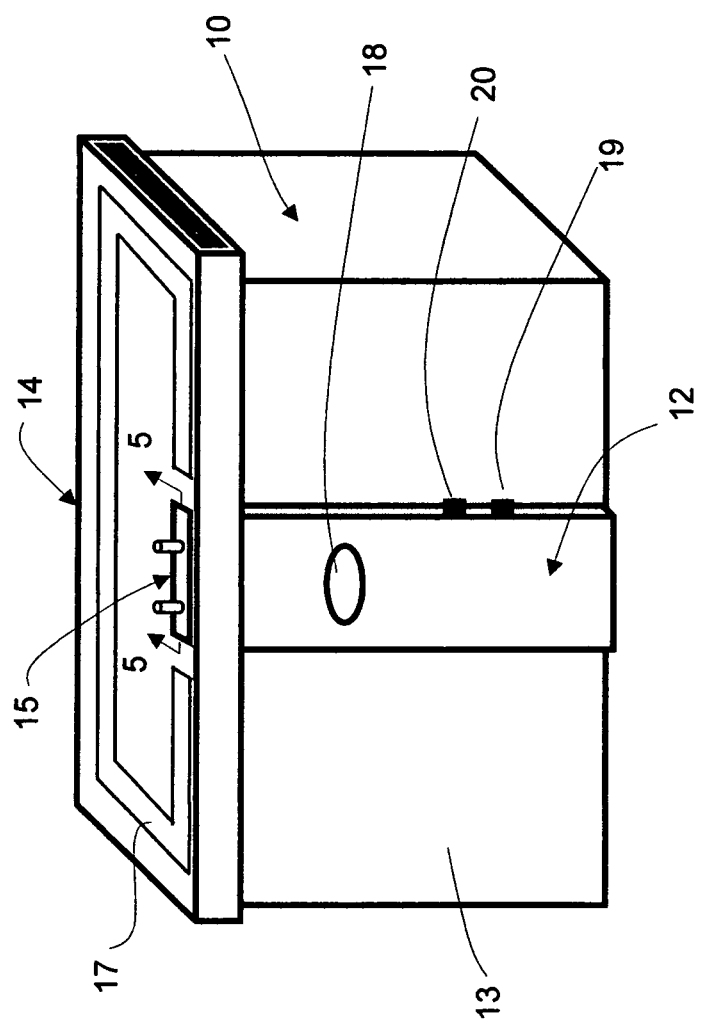
FIG. 1 is a perspective view of a preferred embodiment of a storage container incorporating the invention.

Turning now to the drawings, FIG. 1 is a perspective view of a preferred embodiment of a storage container and a cover incorporating the invention. As seen in this FIG., a storage container 10 has an interconnect panel 12 secured to a front wall 13. In the preferred embodiment, the bottom region of interconnect panel 12 is secured to the bottom region of container wall 13 by any suitable fastening means, such as screw fasteners which pass through holes formed in wall 13 at appropriate positions and engage interconnect panel 12. The top region of interconnect panel 12 is secured to the top region of container wall 13 in the manner described below with reference to FIGS. 2-4. A removable cover 14 is provided with a mechanical and electrical interconnector mechanism 15 in a region overlying the top of the interconnect panel 12 when the cover 14 is mounted on the container 10. Cover 14 is provided with a recess 17 extending generally around the inside of the periphery of cover 14 as part of an auto alignment feature described below. Interconnect panel 12 includes a container visible indicator 18, a USB input port 19, and a USB output port 20. Visible indicator 18 is illuminated whenever an object located in container 10 has an address which matches the address supplied to the container. The object address is supplied to container 10 either directly from a local controller described below in conjunction with FIG. 8, or indirectly from the local controller via a USB cable connected between the container 10 and another container to which the object address has been supplied. USB input port 19 provides an electrical connection to the local controller or the USB output of another container. USB output port 20 functions to provide address output signals to another container when the two are interconnected by a USB jumper cable as described above. This is necessary when the two containers are not mutually stacked in a vertical attitude.

Figure 2:
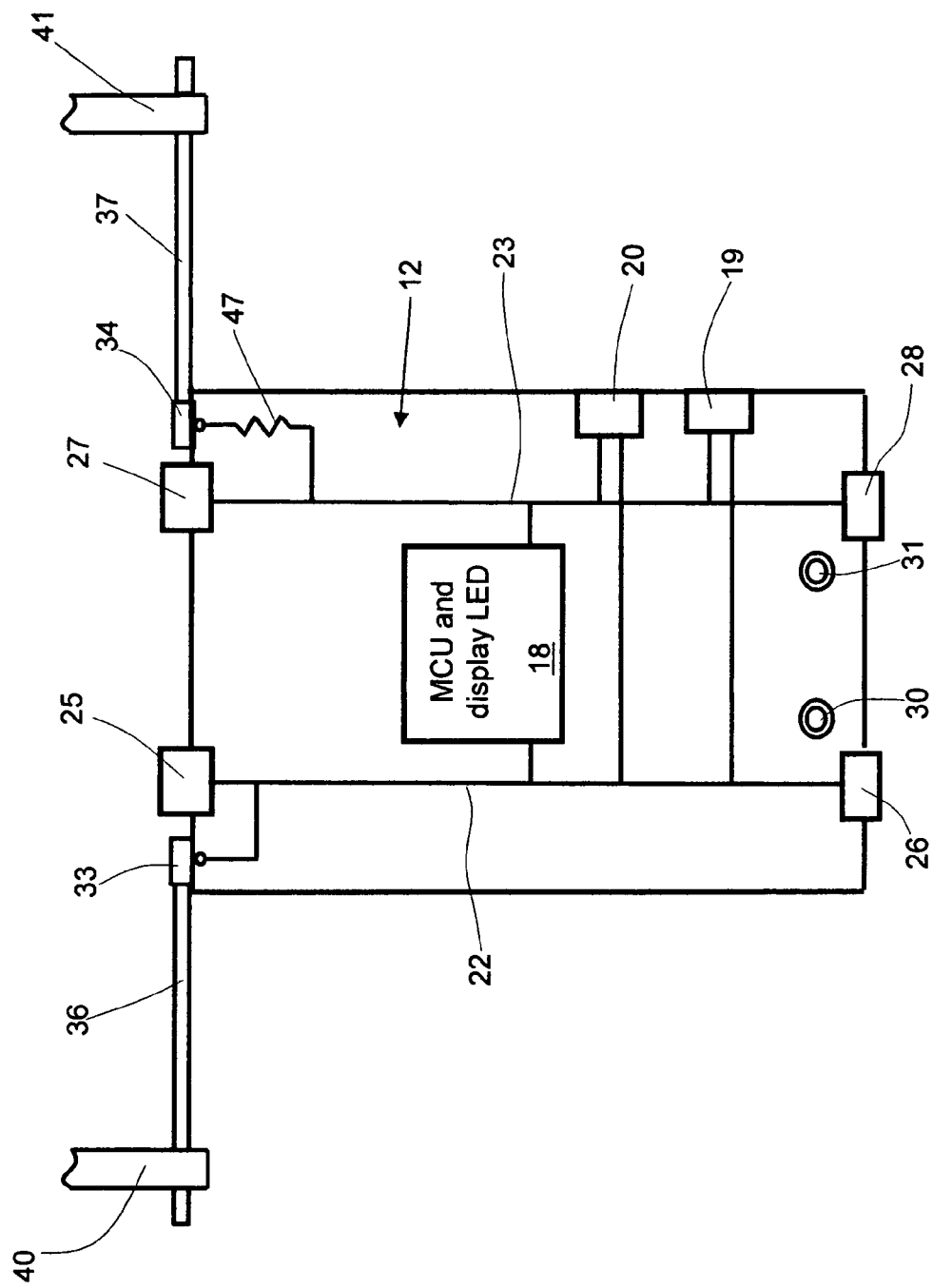
FIG. 2 is a schematic partial plan view illustrating the reverse side of the interconnect panel of FIG. 1 and the interconnection between the panel and the address rails of the container.

FIG. 2 is a schematic partial plan view illustrating the reverse side of the interconnect panel 12. As seen in this FIG., interconnect panel 12 has a pair of electrical address conductors 22, 23 extending from the top region to the bottom region. Conductors 22, 23 may be individual discrete wires or conductive traces plated onto the reverse surface of panel 12. Both address conductors 22, 23 are electrically connected to both the input port 19 and the output port 20 of panel 12. Conductor 22 is connected to an upper electrically conductive terminal pad 25 at the upper end and is connected to a lower electrically conductive terminal pad 26 at the lower end. Similarly, conductor 23 is connected to an upper electrically conductive terminal pad 27 at the upper end and is connected to a lower electrically conductive terminal pad 28 at the lower end. As described more fully below, lower terminal pads 26, 28 electrically connect to the address conductors of a lower container when the container bearing interconnect panel 12 is stacked on top of another container with a cover 14 in between. Upper terminal pads 25, 27 electrically connect to the address conductors of an upper container stacked on top of the container bearing interconnect panel 12. Visible indicator 18 and an MCU are connected between conductors 22, 23.

A pair of fastener receptacles 30, 31 are positioned at the lower region of panel 12 and serve to provide securement means for the fasteners used to secure the lower region of panel 12 to the lower region of container wall 13. Receptacles 30, 31 may be bosses formed in the reverse surface of panel 12, each with a blind bore, or internally threaded nuts adhered to the reverse surface of panel 12. The upper region of panel 12 is secured to the upper region of container 10 by means of mounting clips 33, 34 secured to the upper region of panel 12 in the laterally spaced configuration shown in FIG. 2. Each clip 33, 34 engages an associated electrically conductive rod 36, 37, and each rod 36, 37 is secured to the wall 13 of container 10. Rod 36 is electrically connected to a first conductive rail 40 located in the interior of container 10, while rod 37 is electrically connected to a second conductive rail 41 also located in the interior of container 10. Rails 40, 41 are laterally spaced inside container 10 by an amount designed to receive file folders containing the electrical circuitry described above for receiving object address signals supplied to the container 10.

Figure 4:
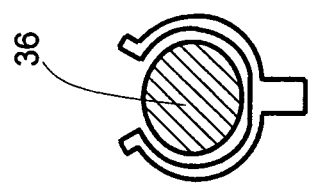
FIG. 4 is a sectional view taken along lines 4-4 of FIG. 3.
Figure 3:
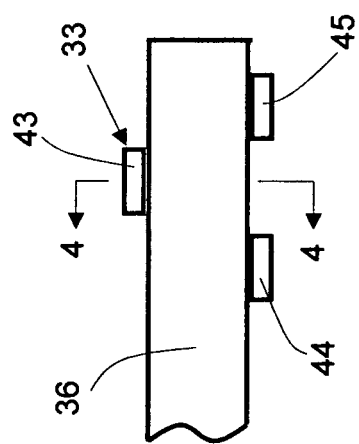
FIG. 3 is an enlarged partial top plan view illustrating the mechanical and electrical connection elements at the top edge of the interconnect panel of FIG. 1.

FIGS. 3 and 4 illustrate the mounting clip 33 installed on rod 36. As seen in these Figs., clip 33 has three upstanding curved arms 43-45 which partially encircle rod 36 to form a releasable clamping connection. The configuration of clip 34 and rod 37 is identical to that depicted in FIGS. 3 and 4. To install interconnect panel 12 on wall 13 of container 10, clips 33, 34 are first maneuvered onto rods 36, 37 to secure the upper region, after which fasteners are maneuvered from the inside of container 10 through the holes formed in the lower region of wall 13 and installed in fastener receptacles 30, 31 to secure the lower region. Panel 12 can be removed from wall 13 of container 10 by simply reversing the steps just described.

Address conductor 22 is electrically connected to clip 33 directly. Address conductor 23 is electrically connected to clip 34 through a resistor 47.

Figure 5:
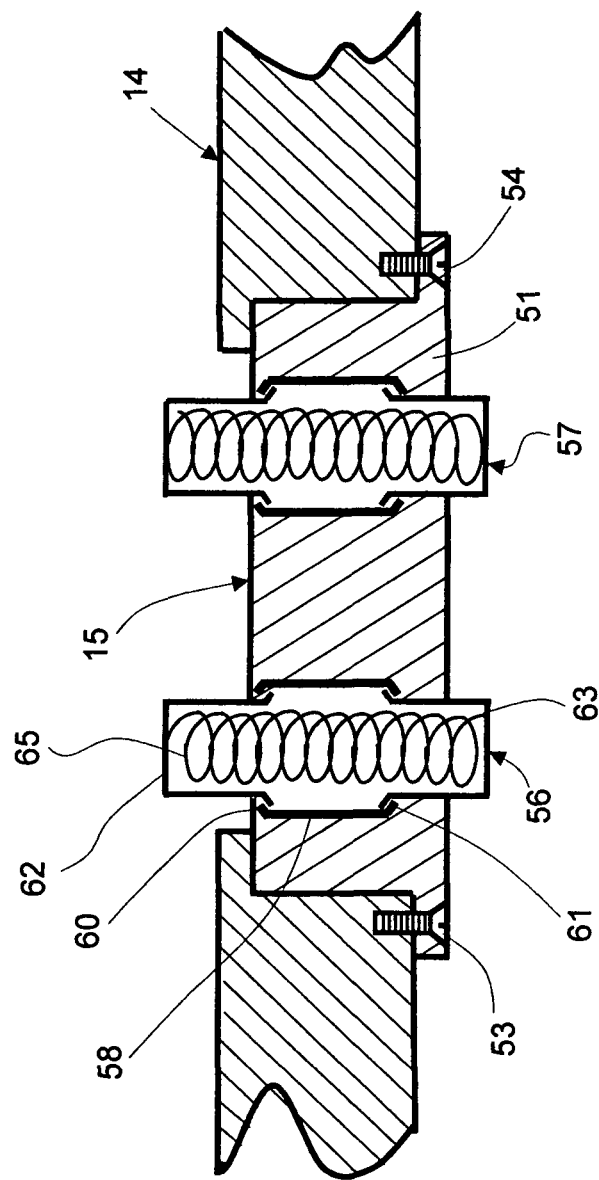
FIG. 5 is an enlarged sectional view taken along lines 5-5 of FIG. 1 illustrating the mechanical and electrical interconnector mechanism mounted in the cover of the container of FIG. 1.

FIG. 5 is an enlarged sectional view taken along lines 5-5 of FIG. 1 illustrating the mechanical and electrical interconnector mechanism 15 mounted in the cover 14 of the container 10. As seen in this FIG., interconnector mechanism 15 includes a mounting block 51 received within an aperture in cover 14 and secured to cover 14 by means of threaded fasteners 53, 54 installed from underneath. Mounting block 51 has a pair of electrically conductive spring biased probe assemblies 56, 57 which are press fitted into laterally spaced, vertically oriented bores formed in mounting block 51. Each probe assembly 56, 57 has a central generally cylindrical ferrule 58 with inwardly turned upper and lower retaining flanges 60, 61, a pair of vertically translatable contact probes 62, 63, and a biassing spring 65 having ends in contact with the inner end surfaces of contact probes 62, 63. The inner end of each contact probe 62, 63 has an outwardly turned retaining flange which can engage with the retaining flanges 60, 61 to capture each contact probe 62, 63 within ferrule 58. Thus, contact probes 52, 63 are capable of translatory motion inwardly of ferrule 58 in the vertical direction when pressure is applied from above or below. In the absence of such pressure, each contact probe 62, 63 is biased to the outward vertical limit by biasing spring 65. In FIG. 5, interconnector mechanism 15 is shown in the quiescent state with no external pressure applied and contact probes 62, 63 in the fully extended state under the influence of biasing spring 65.

Figure 6:
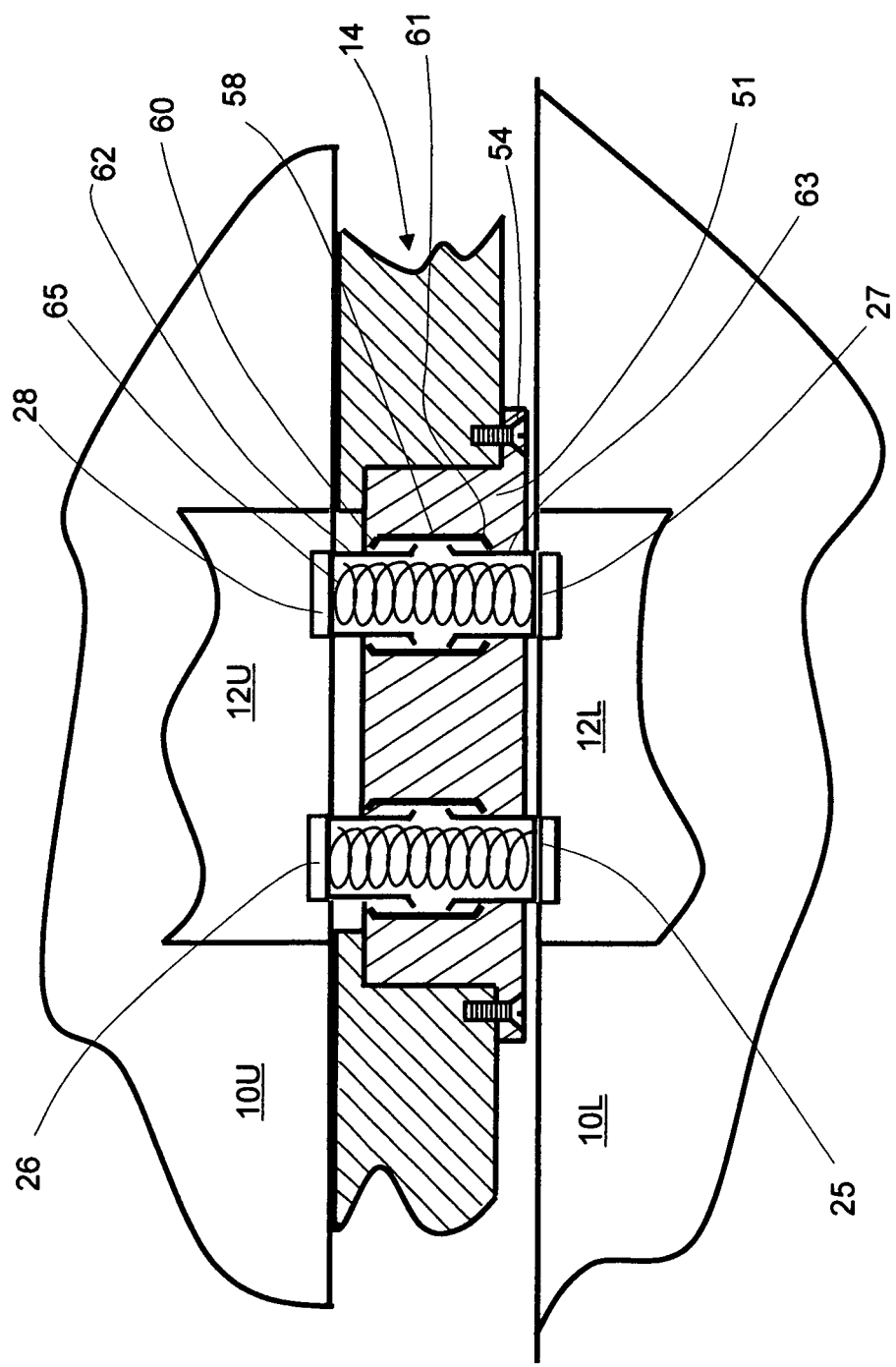
FIG. 6 is an enlarged sectional view illustrating the configuration of the cover-mounted interconnector mechanism when one container is stacked on top of a lower container.

FIG. 6 is an enlarged sectional view similar to FIG. 5 but illustrating the configuration of the cover-mounted interconnector mechanism 15 when one container is stacked on top of another, lower container. As seen in this FIG., the lower electrically conductive terminal pads 26, 28 of the interconnect panel 12 U of the upper container 10 U are mated with the upper contact probes 62 of the interconnector mechanism mounted in the lower container cover 14. The probes 62 are partially retracted into the interior of ferrule 58 by the weight of upper container 10 U. The upper electrically conductive terminal pads 25, 27 of the interconnect panel 12 L of the lower container 10 L are mated with the lower contact probes 63 of the interconnector mechanism 15 mounted in the lower container cover 14. The probes 63 are also partially retracted into the interior of ferrule 58. Biassing spring 65 is compressed thereby assuring effective contact between elements 26, 28, and 62, and between elements 25, 27, and 63. Thus, any address signals present within the electrical address conductors 22, 23 on the interconnect panel 12 in either container are transferred to the electrical address connectors 22, 23 on the interconnect panel 12 in the other container whenever one container is properly stacked on top of another container.

Figure 7B:
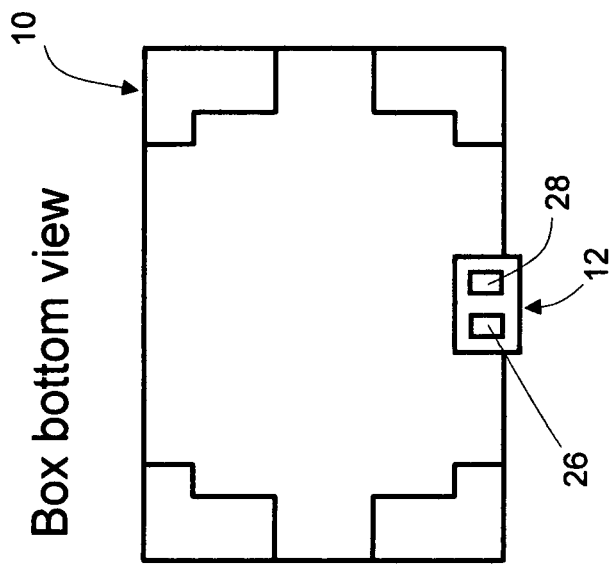
FIGS. 7A and 7B are schematic views of the top of a container cover and the bottom of a container, respectively, illustrating the auto alignment feature of the invention.
Figure 7A:
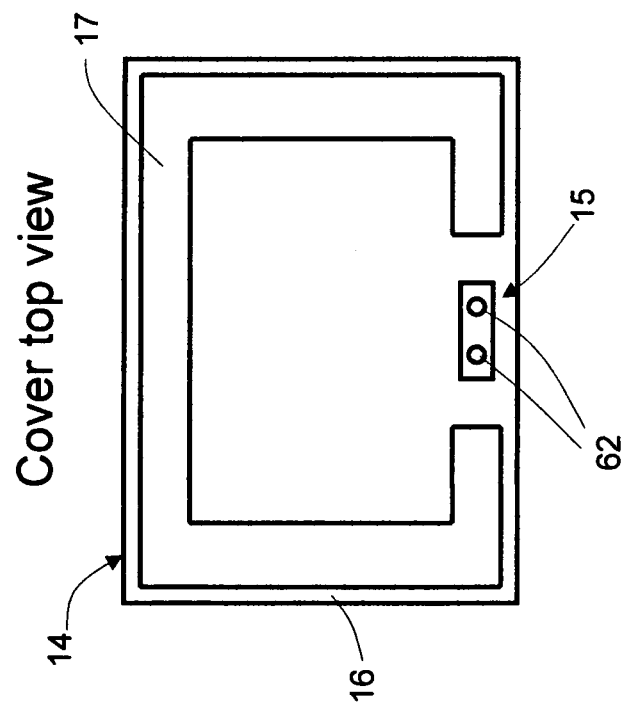

In order to facilitate proper alignment of the containers when stacking, an auto alignment feature is incorporated into the preferred embodiment. FIGS. 7A and 7B, which are schematic views of the top of a container cover 14 and the bottom of a container 10, respectively, illustrate this feature. With reference to FIG. 7A, a recess 17 extends generally peripherally of cover 14 just inwardly of the outer edge 16. With reference to FIG. 7B, the bottom of container 10 has an L-shaped contour at each corner. The relative dimensions of recess 17 and the L-shaped contours are selected so that the bottom of container 10 is snugly received by recess 17 whenever one container is stacked on top of another container. In this aligned configuration, the electrical contact members described about are properly engaged.

Figure 8:
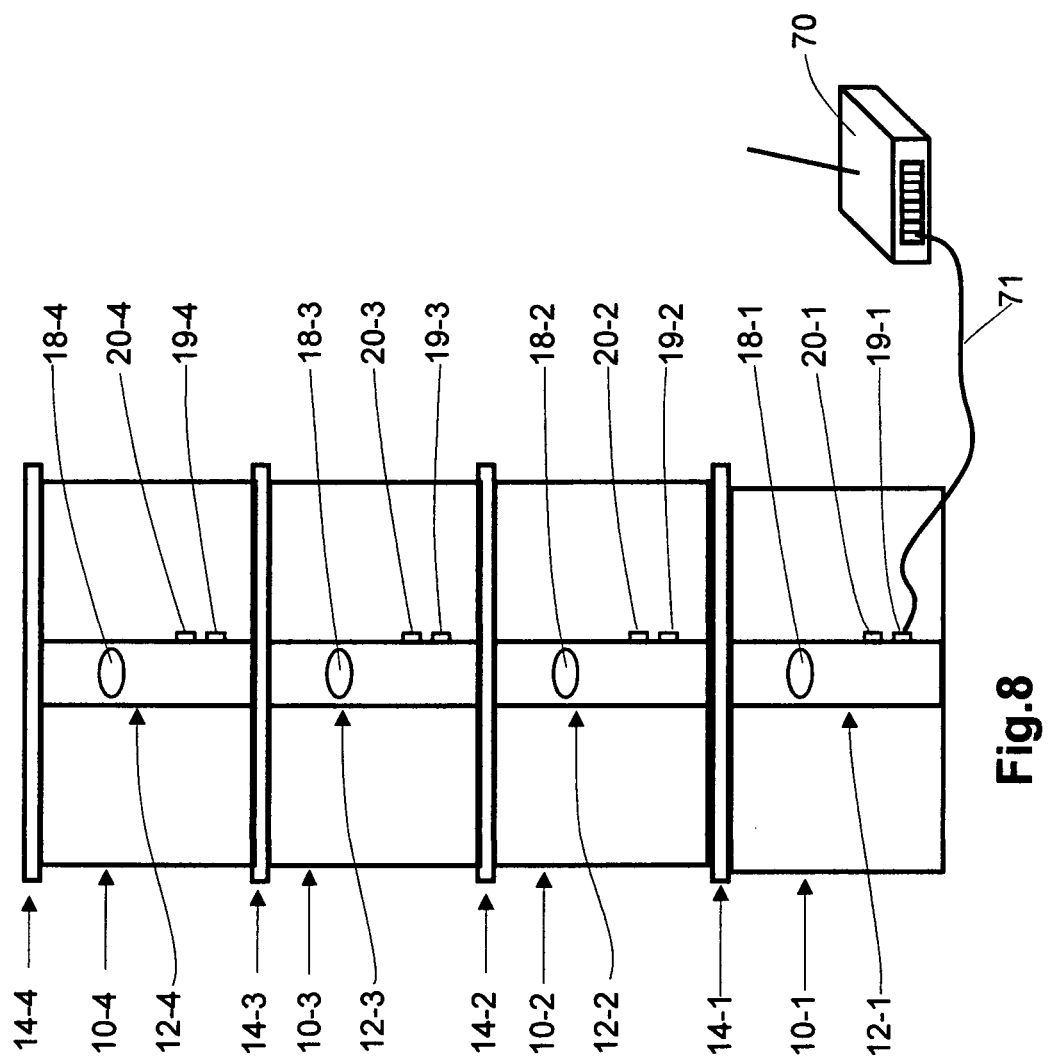
FIG. 8 is a perspective view showing four containers in a vertically stacked array.

FIG. 8 is a perspective view showing four containers 10-1 . . . 10-4 in a vertically stacked array. A local controller 70 is electrically coupled to a first container 10-1 in the stack by means of a USB cable 71 connected to the local controller 70 and the input port 19-1 of container 10-1. Local controller 70 receives object address signals from a host computer (not shown) and supplies these signals to container 10-1. The object address signals are forwarded to the remaining containers in the stack by means of the interconnect panels 12-1 . . . 12-4 and the interconnect mechanisms 15-1 . . . 15-3 in the covers 14-1 . . . 14-3 of the containers 10-1 . . . 10-3. Response signals from any of the containers 10-1 . . . 10-4 are returned to local controller 70 via the same panels and interconnect mechanisms.

As will now be apparent, storage containers incorporating the invention afford the advantage of eliminating the need for attaching USB jumper cables when a plurality of such containers are vertically stacked. At the same time, USB jumper cables can be used to interconnect such containers when they are arrayed in a non-vertically stacked configuration. Further, the auto alignment feature simplifies the stacking process.

Although the above provides a full and complete disclosure of the preferred embodiments of the invention, various modifications, alternate constructions and equivalents will occur to those skilled in the art. For example, while the invention has been described and illustrated with reference to an interconnect panel 12 having a USB output port 20, this port may be eliminated if the container will only be used in a vertically stacked array. In addition, while the auto alignment feature has been described and illustrated with particular contours for the cover 14 and the container bottom, other geometries affording the same auto alignment may be employed, if desired. Therefore, the above should not be construed as limiting the invention, which is defined by the appended claims.

What is claimed is:

1. A storage container for removably storing addressable objects, said storage container including a plurality of walls forming a storage volume with an upper region, and an interconnect panel secured to one of said plurality of walls, said interconnect panel having a top edge and a bottom edge and including a pair of laterally spaced address signal conductors extending between said top edge and said bottom edge and terminating in conductive terminal pads; and a cover for said storage container, said cover including an interconnect mechanism secured thereto and having a laterally spaced pair of spring biased translatable conductive probe assemblies, the location of said interconnect mechanism on said cover and the spacing of said probe assemblies enabling said probe assemblies to individually engage the terminal pads of an upper container and a lower container when said upper container and said lower container are stacked in a vertical manner so that address signals present on the address signal conductors of one of said upper container and said lower container are coupled to the address signal conductors of the other one of said upper container and said lower container.

2. The invention of claim 1 wherein said interconnect panel has an address signal input port coupled to said address signal conductors.

3. The invention of claim 1 wherein said interconnect panel has an address signal output port coupled to said address signal conductors.

4. The invention of claim 1 wherein said interconnect panel has an address signal input port coupled to said address signal conductors and an address signal output port coupled to said address signal conductors.

5. The invention of claim 1 wherein said storage container has a pair of laterally spaced electrically conductive mounting rods within said upper region; and wherein said interconnect panel includes a pair of mounting clips each electrically coupled to a different one of said address signal conductors and each secured to said interconnect panel adjacent said top edge, each said mounting clip being engaged with a different one of said pair of mounting rods to secure said interconnect panel to said wall of said container at the upper edge of said interconnect panel.

6. The invention of claim 5 further including fastener means for securing said interconnect panel to said wall of said container at the lower edge of said interconnect panel.

7. The invention of claim 1 wherein said cover has a top surface, a bottom surface, and an aperture; and wherein said interconnect mechanism includes a mounting block secured to said cover for containing said probe assemblies ,said mounting block being positioned on said cover with a portion of said probe assemblies extending through said aperture.

8. The invention of claim 7 wherein said mounting block has a laterally spaced pair of through bores for containing said probe assemblies; and wherein each one of said pair of probe assemblies includes a generally cylindrical ferrule secured in an associated one of said through bores, a pair of probes translatably received within said ferrule and a biassing spring mounted in said ferrule between said pair of probes for urging said pair of probes outwardly of said mounting block in opposite directions.

9. The invention of claim 1 further including an auto alignment mechanism for urging an upper container into proper physical alignment with the cover of a lower container when the upper container and the lower container are stacked in a vertical manner.

10. The invention of claim 9 wherein said container has a bottom and said cover has an upper surface; and wherein said auto alignment mechanism comprises mutually conformable shapes to the upper surface of said cover and the bottom of a container.

11. For use with an addressable objects storage container having a plurality of walls, an interconnect panel adapted to be secured to one of said plurality of walls, said interconnect panel having a top edge and a bottom edge and including a pair of laterally spaced address signal conductors extending between said top edge and said bottom edge and terminating in conductive terminal pads, and a pair of mounting members each permanently electrically coupled to a different one of said address signal conductors and each secured to said interconnect panel adjacent said top edge, each said mounting member being enqaqeable with a different one of a pair of laterally spaced electrically conductive container mounting members within the upper region of a container so that said interconnect panel can be secured to a wall of the container at the upper edge of said interconnect panel.

12. The invention of claim 11 wherein said interconnect panel has an address signal input port coupled to said address signal conductors.

13. The invention of claim 11 wherein said interconnect panel has an address signal output port coupled to said address signal conductors.

14. The invention of claim 11 wherein said interconnect panel has an address signal input port coupled to said address signal conductors and an address signal output port coupled to said address signal conductors.

15. The invention of claim 11 wherein each of said pair of interconnect panel mounting members is a mounting clip electrically coupled to a different one of said address signal conductors and each secured to said interconnect panel adjacent said top edge, and wherein each said electrically conductive container mounting member is a rod.

16. For use with a storage container having an interconnect panel with address signal conductors and laterally spaced pairs of upper and lower terminal pads, a cover including an interconnect mechanism secured thereto and having a laterally spaced pair of spring biased translatable conductive probe assemblies, the location of said interconnect mechanism on said cover and the spacing of said probe assemblies enabling said probe assemblies to individually engage the terminal pads of an upper container and a lower container when an upper container and a lower container are stacked in a vertical manner so that address signals present on the address signal conductors of one of the upper container and the lower container are coupled to the address signal conductors of the other one of the upper container and the lower container.

17. The invention of claim 16 wherein said interconnect mechanism includes a mounting block secured to said cover for containing said probe assemblies, said mounting block being positioned on said cover with said probe assemblies extending through said aperture.

18. The invention of claim 17 wherein said mounting block has a laterally spaced pair of through bores for containing said probe assemblies; and wherein each one of said pair of probe assemblies includes a generally cylindrical ferrule secured in an associated one of said through bores, a pair of probes translatably received within said ferrule and a biassing spring mounted in said ferrule between said pair of probes for urging said probes outwardly of said mounting block in opposite directions.

* * * * *